US010340902B1

(12) United States Patent
Fortier et al.

(10) Patent No.: US 10,340,902 B1
(45) Date of Patent: Jul. 2, 2019

(54) MULTIPLYING DELAY LOCKED LOOPS WITH COMPENSATION FOR REALIGNMENT ERROR

(71) Applicant: Analog Devices Global Unlimited Company, Hamilton (BM)

(72) Inventors: Justin L. Fortier, Carleton Place (CA); Rachel Katumba, Ottawa (CA)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 15/966,368

(22) Filed: Apr. 30, 2018

(51) Int. Cl.
    *H03L 7/06* (2006.01)
    *H03K 5/00* (2006.01)
    *H03L 7/24* (2006.01)
    *H03L 7/099* (2006.01)

(52) U.S. Cl.
    CPC ....... *H03K 5/00006* (2013.01); *H03L 7/0995* (2013.01); *H03L 7/24* (2013.01); *H03K 2005/00019* (2013.01); *H03K 2005/00156* (2013.01); *H03K 2005/00267* (2013.01)

(58) Field of Classification Search
    CPC ... H03L 7/0814; H03L 7/0812; H03L 7/0805; H03L 7/087; G11C 7/222
    USPC .......................................... 327/116, 119, 158
    See application file for complete search history.

(56) References Cited

U.S. PATENT DOCUMENTS

| 7,994,832 | B2  |   | 8/2011  | Ali et al. |
| 7,999,585 | B2  | * | 8/2011  | Kapusta ................ H03L 7/0816 327/149 |
| 8,384,456 | B1  | * | 2/2013  | Ramaswamy ........ H03L 7/0891 327/149 |
| 9,035,684 | B2  |   | 5/2015  | Jung et al. |
| 2017/0366191 | A1 | * | 12/2017 | Wang ...................... H03L 7/091 |

FOREIGN PATENT DOCUMENTS

| CN | 104601116 A | 5/2015 |
| KR | 2007/0010651 A | 1/2007 |

OTHER PUBLICATIONS

Du et al., "A Low-Phase Noise, Anti-Harmonic Programmable DLL Frequency Multiplier With Period Error Compensation for Spur Reduction" IEEE Transactions on Circuits and Systems—II: Express Briefs, vol. 53, No. 11, Nov. 2006, in 5 pages.

(Continued)

*Primary Examiner* — Anh Q Tra
(74) *Attorney, Agent, or Firm* — Knobbe Martens Olson & Bear LLP

(57) ABSTRACT

Multiplying delay locked loops (MDLLs) with compensation for realignment error are provided. In certain implementations, an MDLL includes a control circuit, a multiplexed oscillator, and an integrate and subtract circuit. The control circuit selectively injects a reference clock signal into the multiplexed oscillator, which operates with an injected period when the reference clock signal is injected and with a natural period when the reference clock signal is not injected. The integrate and subtract circuit receives an oscillator signal from the multiplexed oscillator, and tunes an oscillation frequency of the multiplexed oscillator based on a difference between an integration of the oscillator signal over the injected period and an integration of the oscillator signal over the natural period.

20 Claims, 10 Drawing Sheets

(56) References Cited

OTHER PUBLICATIONS

Farjad-Rad, et al., "A Low-Power Multiplying DLL for Low-Jitter Multigigahertz Clock Generation in Highly Integrated Digital Chips" IEEE Journal of Solid State Circuits, vol. 37, No. 12, Dec. 2002, in 9 pages.

Helal et al., "A Low Jitter 1.6 GHz Multiplying DLL Utilizing a Scrambling Time-to-Digital Converter and Digital Correlation" 2007 Symposium on VLSI Circuits Digest of Technical Papers, in 2 pages.

Maulik et al., "A DLL-Based Programmable Clock Multiplier in 0.18-μm CMOS With 70 dBc Reference Spur" IEEE Journal of Solid State Circuits, vol. 42, No. 8, Aug. 2007, in 7 pages.

Texas Instruments, "LMX2592 High Performance, Wideband PLLatinum™ RF Synthesizer With Integrated VCO," dated Nov. 2017, in 48 pages.

\* cited by examiner

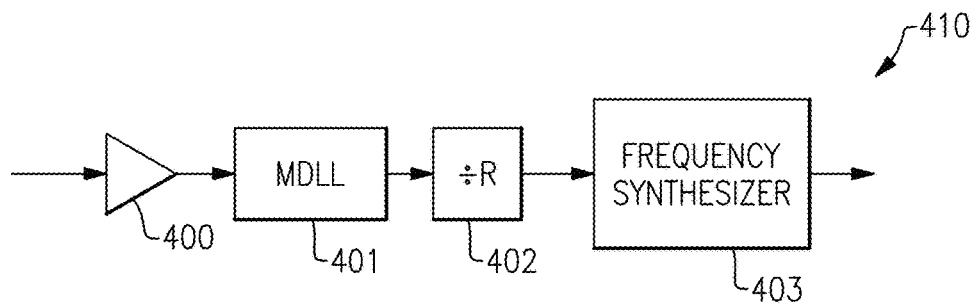
FIG.9A
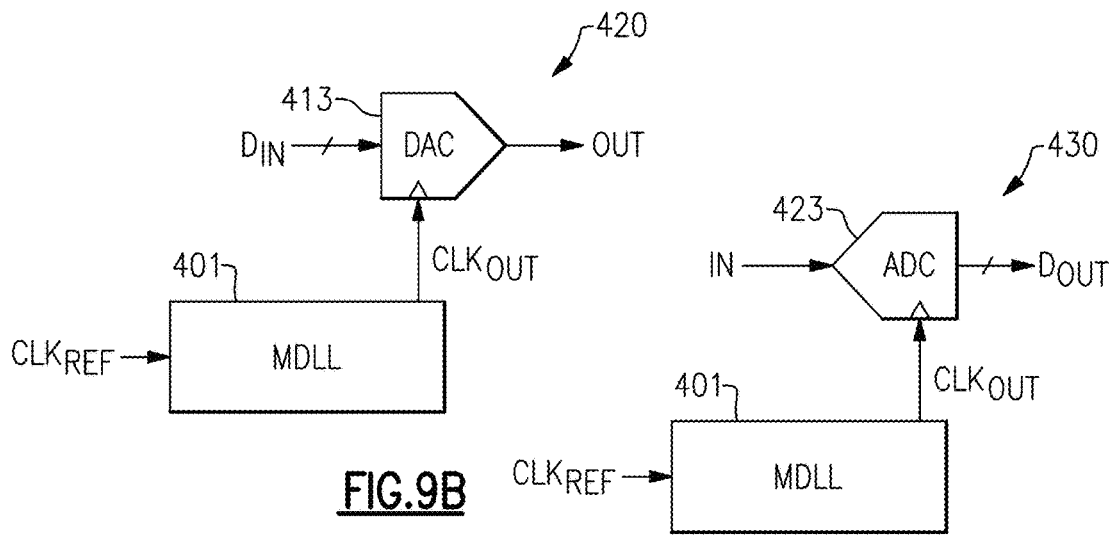
FIG.9B
FIG.9C
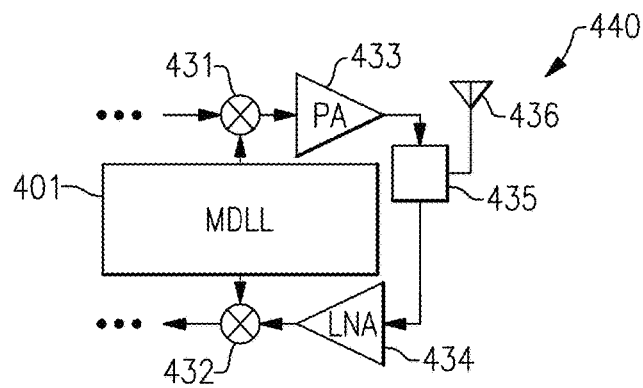
FIG.9D

MULTIPLYING DELAY LOCKED LOOPS WITH COMPENSATION FOR REALIGNMENT ERROR

FIELD OF THE DISCLOSURE

Embodiments of the invention relate to electronic systems, and more particularly, to multiplying delay locked loops (MDLLs).

BACKGROUND

A wide variety of electronic systems operate based on timing of clock signals. For instance, examples of electronic circuitry that operate based on clock signal timing include, but are not limited to, analog-to-digital converters, digital-to-analog converters, wireline or optical data communication links, and/or radio frequency front-ends.

SUMMARY OF THE DISCLOSURE

MDLLs with compensation for realignment error are provided herein. An MDLL can include an oscillator that generates an output clock signal for controlling timing of a downstream circuit, and a multiplexer used to periodically inject a reference clock signal into the oscillator to provide phase realignment. The MDLLs herein include compensation for realignment error arising from the periodic injection of the reference clock signal. By compensating for realignment error, output clock signals of higher spectral purity are generated, which leads to improved performance, lower cost, and/or enhanced design flexibility of the downstream circuit.

In one aspect, an MDLL with compensation for realignment error is provided. The MDLL includes a multiplexed oscillator configured to generate an oscillator signal, a control circuit configured to selectively inject a reference clock signal into the multiplexed oscillator to provide phase realignment, and an integrate and subtract circuit configured to compensate for a realignment error of the multiplexed oscillator based on determining a difference between a first integral of the oscillator signal and a second integral of the oscillator signal.

In another aspect, an electronic system is provided. The electronic system includes an MDLL configured to generate an output clock signal based on timing of a reference clock signal and a downstream circuit having timing controlled by the output clock signal of the MDLL. The MDLL includes a multiplexed oscillator configured to generate an oscillator signal, and the multiplexed oscillator includes a multiplexer configured to receive the reference clock signal and the oscillator signal. The MDLL further includes an integrate and subtract circuit configured to compensate for a realignment error of the multiplexed oscillator based on a difference between a first integral of the oscillator signal and a second integral of the oscillator signal.

In another aspect, a method of compensating for realignment error in an MDLL is provided. The method includes generating an oscillator signal using a multiplexed oscillator, including regularly injecting a reference clock signal into the multiplexed oscillator to thereby provide phase realignment. The method further includes determining a first integral of the oscillator signal, determining a second integral of the oscillator signal, and compensating for a realignment error of the multiplexed oscillator based on a difference between the first integral and the second integral.

BRIEF DESCRIPTION OF THE DRAWINGS

FIG. 9A is a schematic diagram of one embodiment of a frequency synthesis system.

FIG. 9B is a schematic diagram of one embodiment of a digital-to-analog data conversion system.

FIG. 9C is a schematic diagram of one embodiment of an analog-to-digital data conversion system.

FIG. 9D is a schematic diagram of one embodiment of a radio frequency front-end system.

DETAILED DESCRIPTION OF EMBODIMENTS

Figure 1A:
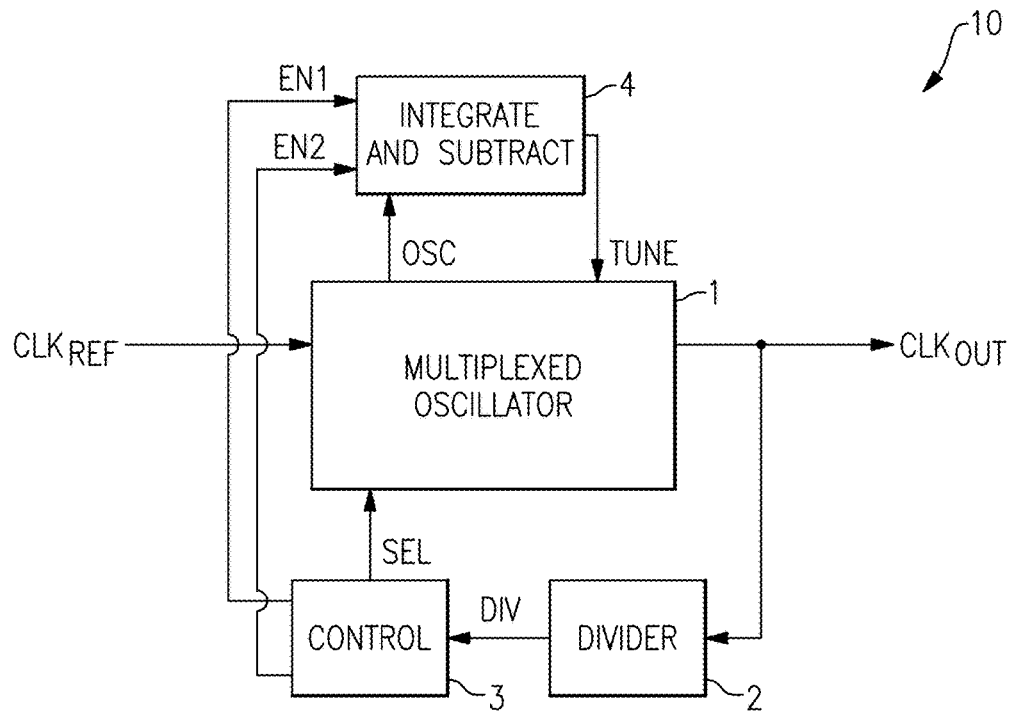
FIG. 1A is a schematic diagram of one embodiment of a multiplying delay locked loop (MDLL) with compensation for realignment error.

The following detailed description of embodiments presents various descriptions of specific embodiments of the invention. In this description, reference is made to the drawings in which like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The performance of electronic systems that operate based on timing of clock signals is impacted by the accuracy and/or precision of the clock signals used to control timing. For example, the performance of such electronic systems can be improved by controlling timing using clock signals with low phase noise and high spectral purity.

A multiplying delay locked loop (MDLL) is a type of electronic circuit used to generate a clock signal for timing control. An MDLL can exhibit lower phase noise than a phase-locked loop (PLL), since an MDLL accumulates less phase noise. For example, certain MDLLs exhibit a 1/f noise profile while PLLs can exhibit a $1/f^2$ noise profile.

MDLLs can be used in a wide variety of applications. In one example, an MDLL generates a clock signal for controlling a timed circuit, such as an analog-to-digital converter (ADC), a digital-to-analog converter (DAC), a wired or optical communication link, and/or a radio frequency (RF) front-end. In another example, the MDLL is used to change the input reference frequency to a fractional synthesizer, thereby helping to avoid boundary spurs at low frequency offsets of the fractional synthesizer. Although various example applications of MDLLs have been described, MDLLs can be used for a variety of purposes in a wide range of electronic systems.

An MDLL can include a ring oscillator and a multiplexer that is used to periodically inject a high quality reference clock signal into the ring oscillator to provide phase realignment. By using a high quality reference clock signal to provide phase realignment, low phase noise is provided. However, realigning the ring oscillator in this manner can generate realignment spurs that appear at the reference rate. For example, the ring oscillator outputs a clock signal in which once every M cycles the clock signal is slightly longer or shorter than other cycles due to realignment error. The Mth cycle represents the cycle of reference injection, and the time difference between the Mth cycle and cycles in which the reference clock signal is not injected represents the realignment error of the MDLL.

Absent correction and/or calibration of the realignment spurs, the realignment spurs degrade the spectral purity of the output clock signal of the MDLL, which can impact the performance of electronic circuitry that operates based on timing of the MDLL's output clock signal.

In certain implementations herein, an MDLL includes a control circuit, a multiplexed oscillator, and an integrate and subtract circuit, such as a switched resistor-capacitor (RC) integrator. The control circuit selectively injects a reference clock signal into the multiplexed oscillator, which operates with an injected period when the reference clock signal is injected and with a natural period when the reference clock signal is not injected. The integrate and subtract circuit receives an oscillator signal from the multiplexed oscillator, and tunes an oscillation frequency of the multiplexed oscillator based on a difference between an integration of the oscillator signal over the injected period and an integration of the oscillator signal over the natural period.

By integrating and subtracting in this manner, a need for a phase-frequency detector and charge pump (PFD/CP) is eliminated, thereby reducing power, area, and/or complexity of the MDLL. Moreover, the integrate and subtract circuit reduces or eliminates realignment error without a need for additional calibration. Rather, realignment is provided to an accuracy of the integration and subtraction operation.

In certain implementations, the integrate and subtract circuit is a switched RC integrator that determines an integral over the injected cycle and an integral over the natural cycle, and uses the difference in integrals to tune the frequency of the multiplexed oscillator. The switched RC integrator can be fully differential, and include a differential amplifier that operates with auto-zeroing and/or chopping to reduce input offset and thereby enhance a precision of integration and subtraction operations.

Thus, the switched RC integrator can operate to determine a difference between an integral of a pulse of the injected period and an integral of a pulse of the natural period (also referred to herein as a non-injected period). The resulting difference in the integrals is used in negative feedback to tune the frequency of the multiplexed oscillator. When in lock, the difference is substantially zero, corresponding to frequency lock and substantially no realignment error.

FIG. 1A is a schematic diagram of one embodiment of an MDLL 10 with compensation for realignment error. The MDLL 10 includes a multiplexed oscillator 1, a divider 2, a control circuit 3, and an integrate and subtract circuit 4.

In the illustrated embodiment, the MDLL 10 receives a reference clock signal $CLK_{REF}$ and generates an output clock signal $CLK_{OUT}$. When in lock, a frequency of the output clock signal $CLK_{OUT}$ is a positive integer M greater than a frequency of the reference clock signal $CLK_{REF}$. Thus, the MDLL 10 operates to multiply the frequency of the reference clock signal $CLK_{REF}$.

As shown in FIG. 1A, the output clock signal $CLK_{OUT}$ is provided to the divider circuit 2, in this embodiment. The divider circuit 2 divides the output clock signal $CLK_{OUT}$ to generate a divided clock signal DIV, which serves as an input to the control circuit 3. In certain implementations, the divider circuit 2 operates with a divisor of M, which can be selectable (for instance, by digitally controlling the MDLL 10).

The control circuit 3 generates a clock selection signal SEL, a first enable signal EN1, and a second enable signal EN2 based on timing of the divided clock signal CLK. The clock selection signal SEL is used to control the multiplexed oscillator 1 to selectively inject the reference clock signal $CLK_{REF}$ into the multiplexed oscillator 1. The multiplexed oscillator 1 operates with an injected period when the reference clock signal $CLK_{REF}$ is injected and with a natural or non-injected period when the reference clock signal $CLK_{REF}$ is not injected. In certain implementations, the selection signal SEL is activated once every M cycles of the output clock signal $CLK_{OUT}$.

The integrate and subtract circuit 4 receives an oscillator signal OSC from the multiplexed oscillator 1, and generates a tuning signal TUNE for tuning an oscillation frequency (for example, the non-injected period) of the multiplexed oscillator 1. The oscillator signal OSC can be any suitable signal from the multiplexed oscillator 1, including, but not limited to, a feedback clock signal to a multiplexer of the multiplexed oscillator 1. The integrate and subtract circuit 4 controls the tuning signal TUNE based on comparing the injected period of the multiplexed oscillator 1 to the natural period of the multiplexed oscillator 1.

For example, the integrate and subtract circuit 4 can operate to tune the frequency of the multiplexed oscillator 1 based on a difference between an integration taken during the injected period and an integration taken during the natural period. As shown in FIG. 1A, the integrate and subtract circuit 4 receives the first enable signal EN1 and the second enable signal EN2 from the control circuit 3, in this embodiment. In certain implementations, the first enable signal EN1 is activated once every M cycles when the reference clock signal $CLK_{REF}$ is injected, and the second enable signal EN2 is activated a cycle after the first enable signal EN1 is activated.

In the illustrated embodiment, the first enable signal EN1 controls integration over the injected period and the second enable signal EN2 controls integration over the natural period. In certain implementations, the integrals are taken during successive cycles of the oscillator signal OSC.

For example, the control circuit 3 can activate the first enable signal EN1 during an injected period, such that the integrate and subtract circuit 4 determines an integral of the oscillator signal OSC over at least a portion of the injected period. Additionally, the control circuit can activate the second enable signal EN2 during a natural period, such that the integrate and subtract circuit 4 determines an integral of the oscillator signal over at least a portion of the natural period. The integrate and subtract circuit 4 determines a difference between the integrals, and uses the result to control the tuning signal TUNE, thereby providing negative feedback to control the frequency of the multiplexed oscillator 1. When in lock, the difference is substantially zero, corresponding to frequency lock and substantially no realignment error.

Figure 1B:
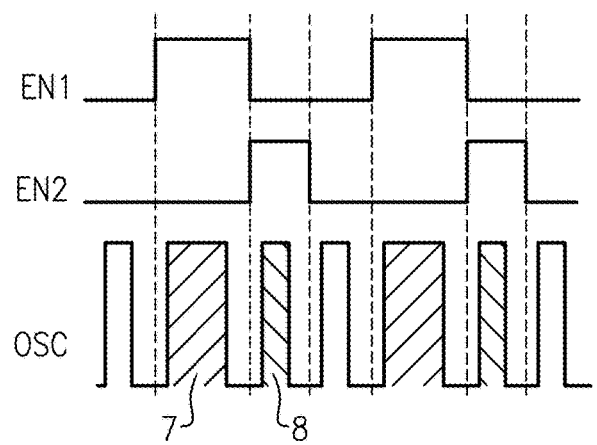
FIG. 1B is one example of a timing diagram for the MDLL of FIG. 1A.

FIG. 1B is one example of a timing diagram for the MDLL 10 of FIG. 1A. The timing diagram includes a plot of the first enable signal EN1 versus time, a plot of the second enable signal EN2 versus time, and a plot of the oscillator signal OSC versus time.

With reference back to FIG. 1A, the control circuit 3 periodically injects the reference clock signal $CLK_{REF}$ into the multiplexed oscillator 1 using the clock selection signal SEL. For example, the control circuit 3 can operate to inject the reference clock signal $CLK_{REF}$ once out of every M cycles of the output clock signal $CLK_{OUT}$, where M is an integer greater than 1. When the MDLL 10 is out of lock, the output clock signal $CLK_{OUT}$ (as well as the oscillator signal OSC) can be slightly longer or shorter on injected cycles relative to non-injected cycles due to realignment error.

As shown in FIG. 1B, since the MDLL 10 has not yet acquired lock, a pulse width of the oscillator signal OSC is different based on whether a particular pulse is associated with an injected cycle in which the reference clock signal $CLK_{REF}$ is injected or a natural cycle in which the reference clock signal $CLK_{REF}$ is not injected. In this example, M is equal to three such that reference injection occurs once every three cycles. FIG. 1B has been annotated to depict an injected pulse 7 associated with an injected period of the multiplexed oscillator 1 and a natural pulse 8 associated with a natural period of the multiplexed oscillator 1.

The difference in pulse width between the injected pulse 7 and the natural pulse 8 represents the realignment error of the MDLL 10.

The integrate and subtract circuit 4 operates to tune the frequency of the multiplexed oscillator 1 based on a difference between an integration over the injected period (for example, an integral of the injected pulse 7) and an integration over the natural period (for example, an integral of the natural pulse 8), and uses the result to control the tuning signal TUNE. Thus, the integrate and subtract circuit 4 provides negative feedback to control the frequency of the multiplexed oscillator 1. When in lock, the difference is substantially zero, corresponding to frequency lock and substantially no realignment error.

Figure 1C:
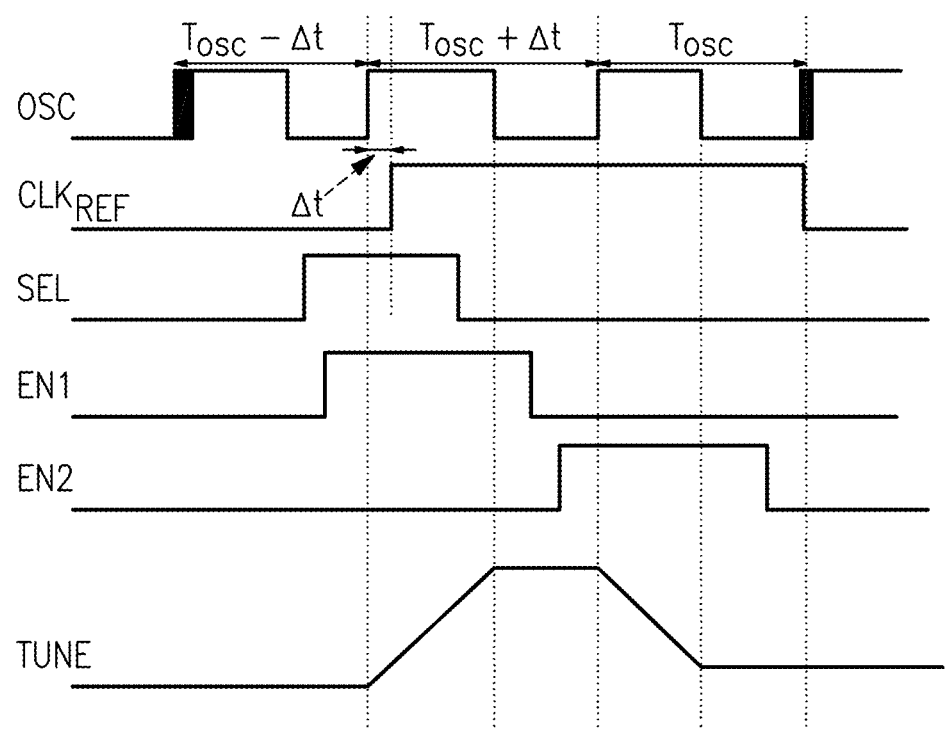
FIG. 1C is another example of a timing diagram for the MDLL of FIG. 1A.

FIG. 1C is another example of a timing diagram for the MDLL 10 of FIG. 1A. The timing diagram includes a plot of the oscillator signal OSC versus time, a plot of the reference clock signal $CLK_{REF}$ versus time, a plot of the clock selection signal SEL versus time, a plot of the first enable signal EN1 versus time, a plot of the second enable signal EN2 versus time, and a plot of the tuning signal TUNE versus time.

The timing diagram has been annotated to show a time difference Δt between a rising edge of the oscillator signal OSC and a corresponding rising edge of the reference clock signal $CLK_{REF}$. The timing diagram has further been annotated to show the length of various periods of the oscillator signal OSC relative to a desired oscillator period $T_{OSC}$.

Figure 2:
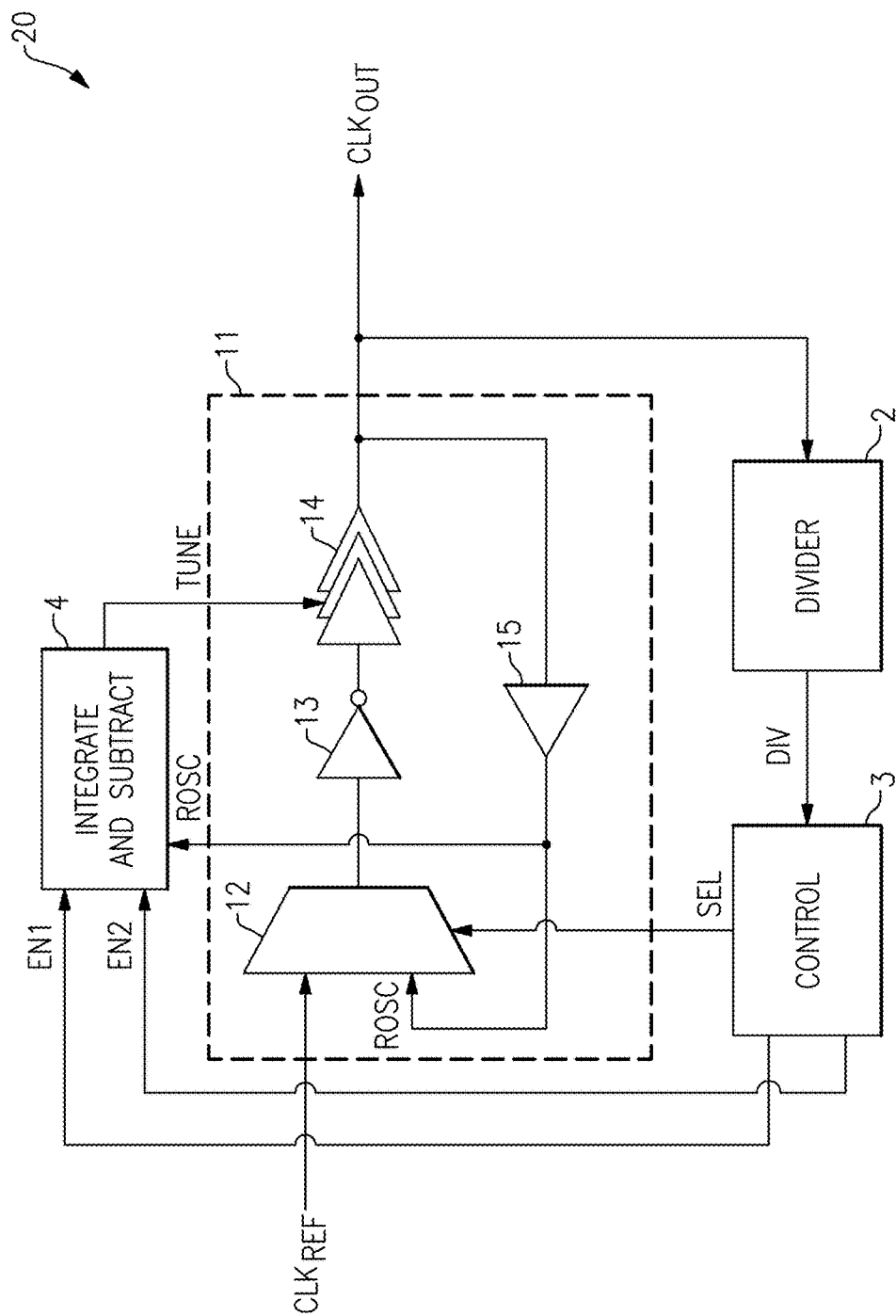
FIG. 2 is a schematic diagram of another embodiment of an MDLL with compensation for realignment error.

FIG. 2 is a schematic diagram of another embodiment of an MDLL 20 with compensation for realignment error. The MDLL 20 includes a multiplexed ring oscillator 11, a divider 2, a control circuit 3, and an integrate and subtract circuit 4.

The MDLL 20 of FIG. 2 is similar to the MDLL 10 of FIG. 1A, except that the MDLL 20 of FIG. 2 illustrates a particular implementation of a multiplexed oscillator. In particular, the MDLL 20 includes the multiplexed ring oscillator 11, which includes a multiplexer 12, an inverter 13, a tunable delay circuit 14, and feedback buffer 15. Although one implementation of a multiplexed oscillator is depicted in FIG. 2, an MDLL can include a multiplexed oscillator implemented in a wide variety of ways, including, but not limited to, using a different implementation of a multiplexer and/or oscillator.

As shown in FIG. 2, the multiplexer 12 receives the clock selection signal SEL, which controls selection between the reference clock signal $CLK_{REF}$ and a ring oscillator signal ROSC. When the ring oscillator signal ROSC is selected, the ring formed by the inverter 13, the tunable delay circuit 14, and the feedback buffer 15 is unbroken, and thus the multiplexed ring oscillator 11 oscillates with a natural period. However, when the reference clock signal $CLK_{REF}$ is selected, the ring is broken and the multiplexed ring oscillator 11 operates with an injected period associated with the reference clock signal $CLK_{REF}$.

In the illustrated embodiment, the integrate and subtract circuit 4 receives the ring oscillator signal ROSC, which the integrate and subtract circuit 4 processes to generate a tuning signal TUNE for controlling a delay of the tunable delay circuit 14 and thus the natural period of the multiplexed ring oscillator 11. Although the integrate and subtract circuit 4 performs integration and subtraction on the ring oscillator signal ROSC in this embodiment, the integrate and subtract circuit 4 can process any suitable clock signal, such as another clock signal along the ring.

Thus, in this example, the integrate and subtract circuit 4 provides frequency tuning based on a difference between an integral over the injected period and an integral over the natural or non-injected period. By providing frequency tuning in this manner, the integrate and subtract 4 compensates for realignment error of the multiplexed ring oscillator 11, including any realignment error arising from non-idealities of the multiplexer 12.

Figure 3A:
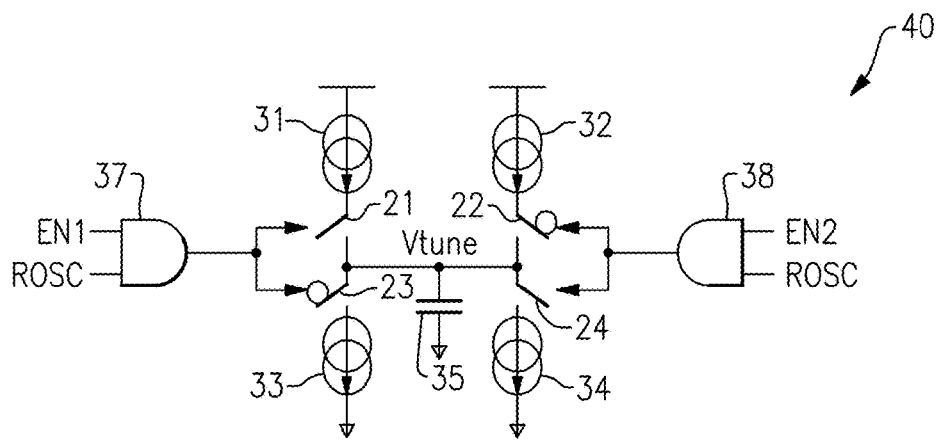
FIG. 3A is a schematic diagram of one embodiment of an integrate and subtract circuit for an MDLL.

FIG. 3A is a schematic diagram of one embodiment of an integrate and subtract circuit 40 for an MDLL. The integrate and subtract circuit 40 illustrates one example of a suitable circuit for providing integration and subtraction in an MDLL implemented in accordance with the teachings herein. Although FIG. 3A illustrates one embodiment of an integrate and subtract circuit, the teachings herein are applicable to MDLLs including integrate and subtract circuits implemented in a wide variety of ways.

The integrate and subtract circuit 40 includes a first integration switch 21, a second integration switch 22, a first de-integration switch 23, a second de-integration switch 24, a first up current source 31, a second up current source 32, a first down current source 33, a second down current source 34, a capacitor 35, a first AND gate 37, and a second AND gate 38.

As shown in FIG. 3A, a voltage across the capacitor 35 serves as a tuning voltage Vtune for controlling an oscillation frequency of an MDLL's oscillator. For example, the tuning voltage Vtune can be used to control a delay of a controllable delay element in a ring oscillator of the MDLL. The capacitor 35 is charged by the first up current source 31 when the first integration switch 21 is closed, and charged by the second up current source 32 when the second integration switch 22 is closed. Additionally, the capacitor 35 is discharged by the first down current source 33 when the first de-integration switch 23 is closed, and discharged by the second down current source 34 when the second de-integration switch 24 is closed.

In the illustrated embodiment, digital logic circuitry is used to control integration or de-integration of the capacitor 35. For example, the first AND gate 37 operates to open or close the first integration switch 21 and to open or close the first de-integration switch 23 based on an AND operation of the first enable signal EN1 and the ring oscillator signal ROSC. Additionally, the second AND gate 38 operates to open or close the second integration switch 22 and to open or close the second de-integration switch 24 based on an AND operation of the second enable signal EN2 and the ring oscillator signal ROSC.

Figure 3B:
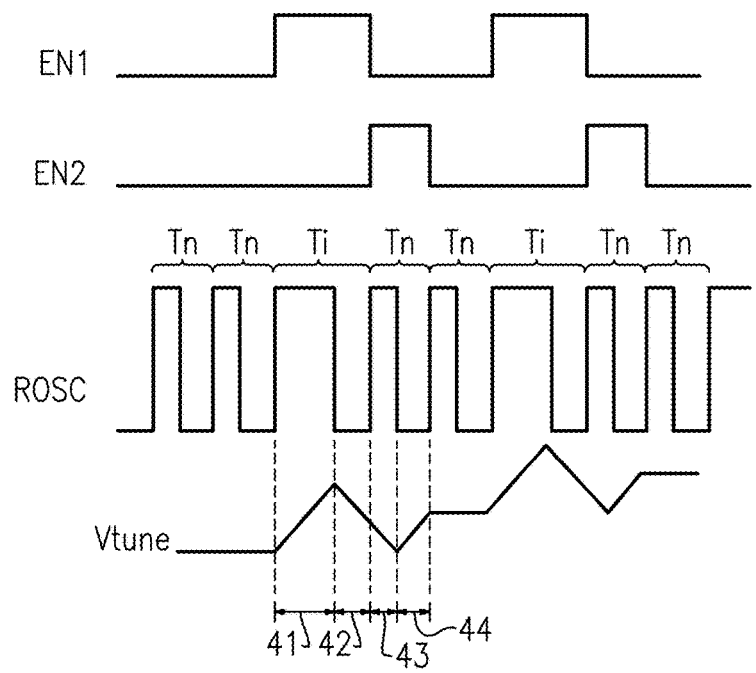
FIG. 3B is one example of a timing diagram for the integrate and subtract circuit of FIG. 3A.

FIG. 3B is one example of a timing diagram for the integrate and subtract circuit 40 of FIG. 3A. The timing diagram includes a plot of the first enable signal EN1 versus time, a plot of the second enable signal EN2 versus time, a plot of the ring oscillator signal ROSC versus time, and a plot of the tuning voltage Vtune versus time.

As shown in FIG. 3B, a period of the ring oscillator signal ROSC changes based on whether a particular cycle is an injected period Ti associated with reference injection or a natural period Tn in which a reference clock signal is not injected. In the illustrated example, the reference clock signal $CLK_{REF}$ is injected once out of every three cycles.

The integrate and subtract circuit 40 operates to control the tuning voltage Vtune based on a difference between an integral of the ring oscillator signal ROSC during the injected period Ti and an integral of the ring oscillator signal ROSC during the natural period Tn.

In this embodiment, the integrate and subtract circuit 40 charges the capacitor 35 during a first portion 41 of the injected period Ti (corresponding to a high value of ROSC, in this example), discharges the capacitor 35 during a second portion 42 of the injected period Ti (corresponding to a low value of ROSC, in this example), discharges the capacitor 35 during a first portion 43 of the natural period Tn (corresponding to a high value of ROSC, in this example), and charges the capacitor 35 during a second portion 44 of the natural period Tn (corresponding to a low value of ROSC, in this example).

By charging and discharging the capacitor 35 in this manner, the capacitor 35 stores an amount of charge corresponding to a difference between an integral of the ring oscillator signal ROSC during the injected period Ti and an integral of the ring oscillator signal ROSC during the natural period Tn.

Figure 4A:
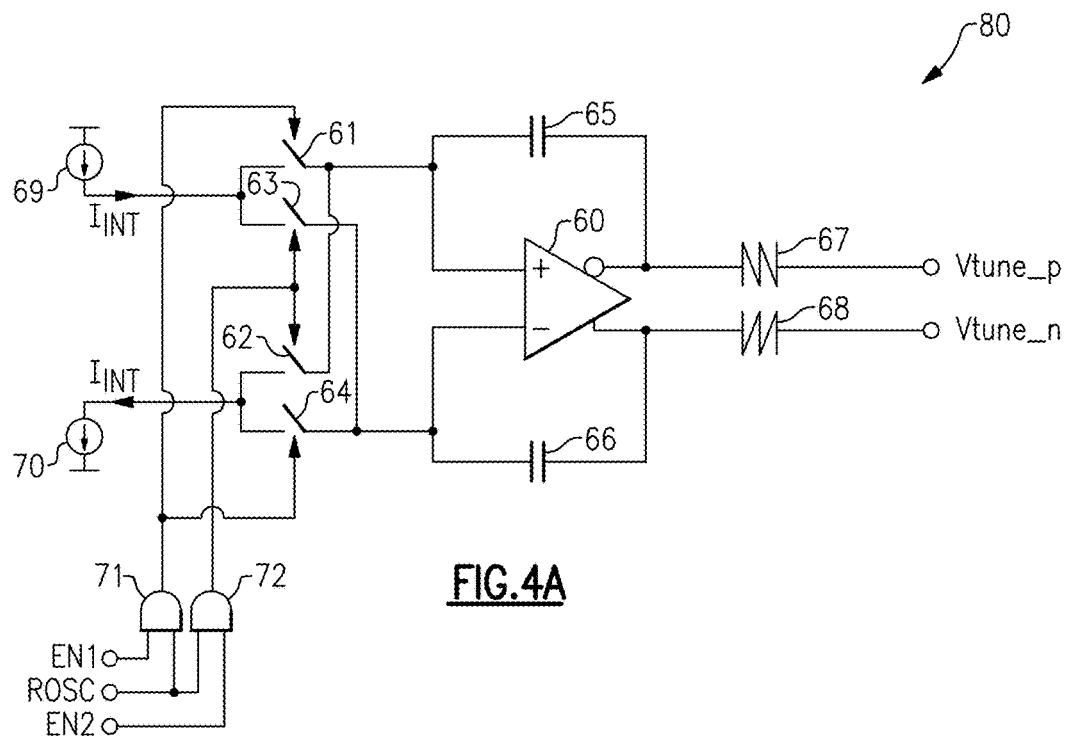
FIG. 4A is a schematic diagram of another embodiment of an integrate and subtract circuit for an MDLL.

FIG. 4A is a schematic diagram of another embodiment of an integrate and subtract circuit 80 for an MDLL. The integrate and subtract circuit 80 illustrates another example of a suitable circuit for providing integration and subtraction in an MDLL implemented in accordance with the teachings herein. In this embodiment, the integrate and subtract circuit 80 is implemented as a switched RC integrator. However, integrate and subtract circuits can be implemented in a wide variety of ways.

The integrate and subtract circuit 80 includes a differential amplifier 60, a first integration control switch 61, a second integration control switch 62, a third integration control switch 63, a fourth integration control switch 64, a first integration capacitor 65, a second integration capacitor 66, a first output resistor 67, a second output resistor 68, a first current source 69, a second current source 70, a first AND gate 71, and a second AND gate 72.

In the illustrated embodiment, the first integration capacitor 65 is electrically connected between a first input and a first output of the differential amplifier 60, and the second integration capacitor 66 is electrically connected between a second input and a second output of the differential amplifier 60. Additionally, the first output resistor 67 is electrically connected between the first output of the differential amplifier 60 and a non-inverted tuning voltage Vtune_p, and the second output resistor 68 is electrically connected between the second output of the differential amplifier 60 and an inverted tuning voltage Vtune_n. The first integration control switch 61 is electrically connected between the first current source 69 and the first input of the differential amplifier 60, and the second integration control switch 62 is electrically connected between the second current source 70 and the first input of the differential amplifier 60. Additionally, the third integration control switch 63 is electrically connected between the first current source 69 and a second input of the differential amplifier 60, and the fourth integration control switch 64 is electrically connected between the second current source 70 and the second input of the differential amplifier 60.

A differential tuning voltage corresponding to a difference between the non-inverted tuning voltage Vtune_p and the inverted tuning voltage Vtune_n serves as a tuning voltage for controlling an oscillation frequency of an MDLL's oscillator.

In the illustrated embodiment, digital logic circuitry is used to open or close each of the switches 61-64. For example, the first AND gate 71 operates to open or close the first integration control switch 61 and the fourth integration control switch 64 based on an AND operation of the first enable signal EN1 and the ring oscillator signal ROSC. Additionally, the second AND gate 72 operates to open or close the second integration control switch 62 and the third integration control switch 63 based on an AND operation of the second enable signal EN2 and the ring oscillator signal ROSC.

As shown in FIG. 4A, the first current source 69 sources an integration current $I_{INT}$ and the second current source 70 sinks the integration current $I_{INT}$. The first current source 69 and the second current source 70 are used to provide desired charging or discharging of the integration capacitors 65-66. In certain implementations, the integration current $I_{INT}$ is controllable to thereby provide a mechanism for selecting a desired magnitude of the integration current $I_{INT}$.

Figure 4B:
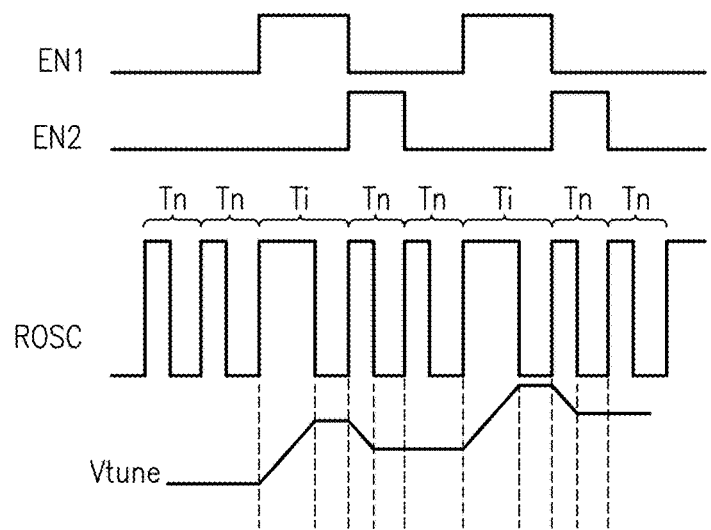
FIG. 4B is one example of a timing diagram for the integrate and subtract circuit of FIG. 4A.

FIG. 4B is one example of a timing diagram for the integrate and subtract circuit of FIG. 4A. The timing diagram includes a plot of the first enable signal EN1 versus time, a plot of the second enable signal EN2 versus time, a plot of the ring oscillator signal ROSC versus time, and a plot of the differential tuning voltage Vtune versus time.

The integrate and subtract circuit 80 operates to control the differential tuning voltage Vtune based on a difference between an integral of the ring oscillator signal ROSC during an injected period Ti and an integral of the ring oscillator signal ROSC during a natural period Tn. In this embodiment, the integral during the injected period Ti and the integral during the natural period Tn are taken while the ring oscillator signal ROSC has a high value. However, other implementations are possible, such as integrate and subtract circuits that compute integrals during a low value, a high value, or a combination thereof.

Figure 5:
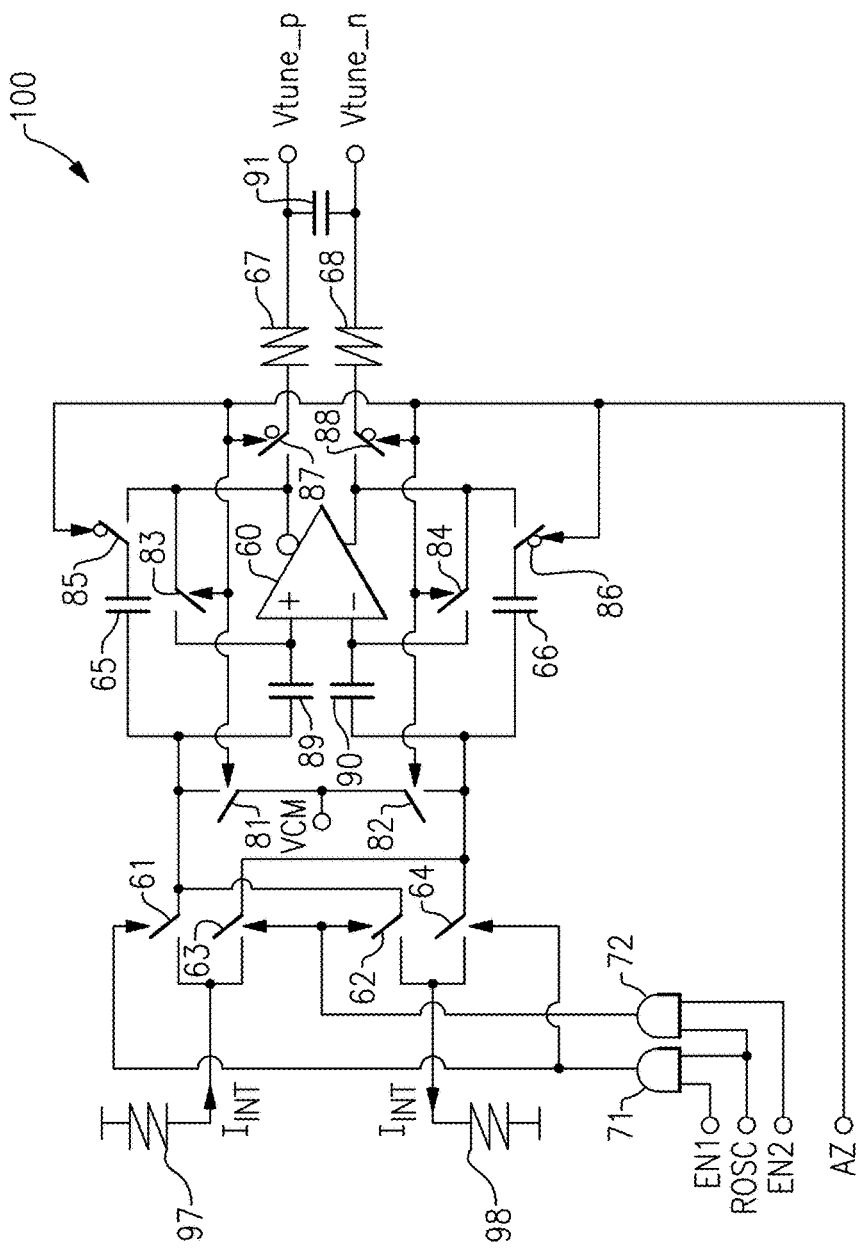
FIG. 5 is a schematic diagram of another embodiment of an integrate and subtract circuit for an MDLL.

FIG. 5 is a schematic diagram of another embodiment of an integrate and subtract circuit 100 for an MDLL. In this embodiment, the integrate and subtract circuit 100 is implemented as a switched RC integrator. However, integrate and subtract circuits can be implemented in a wide variety of ways.

The integrate and subtract circuit 100 of FIG. 5 is similar to the integrate and subtract circuit 80 of FIG. 4A, except that the integrate and subtract circuit 100 further includes a first auto-zeroing switch 81, a second auto-zeroing switch 82, a third auto-zeroing switch 83, a fourth auto-zeroing switch 84, a fifth auto-zeroing switch 85, a sixth auto-zeroing switch 86, a seventh auto-zeroing switch 87, an eighth auto-zeroing switch 88, a first auto-zeroing capacitor 89, a second auto-zeroing capacitor 90, and a holding capacitor 91. Furthermore, the illustrated embodiment includes a first current source resistor 97 and a second current source resistor 98, which correspond to one implementation of the first current source 69 and second current source 70, respectively, of FIG. 4A.

By including the switches 81-88 and the capacitors 89-90, auto-zeroing of the differential amplifier 60 to remove input offset is provided during an auto-zeroing cycle. In particular, when the auto-zeroing signal AZ is activated, the switches 87-88 open to disconnect the outputs of the differential amplifier 60 from the differential tuning voltage and the switches 85-86 open to inhibit charge integration on the integration capacitors 65-66. Additionally, the switches 81-84 close such that the differential amplifier 60 controls the capacitors 89-90 to store a voltage corresponding to an input offset of the differential amplifier 60. For example, the switches 81-82 control one end of the capacitors 89-90 to a common-mode voltage $V_{CM}$, while the differential amplifier 60 controls the voltages at the other end of the capacitors 89-90 based on the input offset of the differential amplifier 60. After the auto-zeroing cycle, the charge stored on the capacitors 89-90 compensates for the differential amplifier's input offset.

By compensating for the input offset voltage of the differential amplifier 60, an accuracy of an integrate and subtract operation of the switched RC integrator 100 can be enhanced. Although one example of auto-zeroing is shown, an input offset of a differential amplifier can be corrected in many ways, including, but not limited, using a wide variety of auto-zeroing and/or chopping circuitry. Thus, any suitable input offset compensation circuit can be used.

The differential amplifier 60 can be calibrated to compensate for input offset voltage at a wide variety of times. For example, an auto-zeroing cycle can be performed at start-up and/or during operation. For instance, the switches 87-88 and holding capacitor 91 can be included to hold the differential tuning voltage substantially constant during an auto-zeroing cycle, thereby keeping the gated ring oscillator in normal operation during auto-zeroing. In certain implementations, input offset compensation occurs regularly during MDLL operation, for instance, once every 100 or more cycles of the multiplexed oscillator.

In the illustrated embodiment, the integrate and subtract circuit 100 includes the first current source resistor 97 for sourcing the integration current $I_{INT}$ and the second current source resistor 98 for sinking the integration current $I_{INT}$, thereby controlling charging and discharging of the integration capacitors 65-66. Although one example of circuitry for generating integration currents is shown, integration currents for a switched RC integrator can be generated in a wide variety of ways.

In certain implementations, the resistance of the first current source resistor 97 and/or the second current source resistor 98 are controllable (for instance, programmable and/or tunable), thereby providing a mechanism to change a loop bandwidth of the MDLL. For example, the resistance can control the magnitude of the integration current $I_{INT}$ and thus a rate at which the integration capacitors 65-66 are charged or discharged. Thus, changing the resistances can be used to control loop bandwidth.

In the embodiments discussed above, an integrate and subtract circuit controls tunes an oscillation frequency of a multiplexed oscillator of an MDLL. By implementing the MDLL in this manner, a need for a phase-frequency detector and charge pump (PFD/CP) is eliminated, thereby reducing power, area, and/or complexity of the MDLL.

In other embodiments, an MDLL includes a PFD/CP for frequency tuning and an integrate and subtract circuit that generates a calibration signal that corrects for a realignment error. In these embodiments, the oscillation frequency of the multiplexed oscillator is controlled by a PFD/CP, while the integrate and subtract circuit operates to generate a calibration signal for the PFD/CP to thereby reduce or eliminate realignment error.

Figure 6:
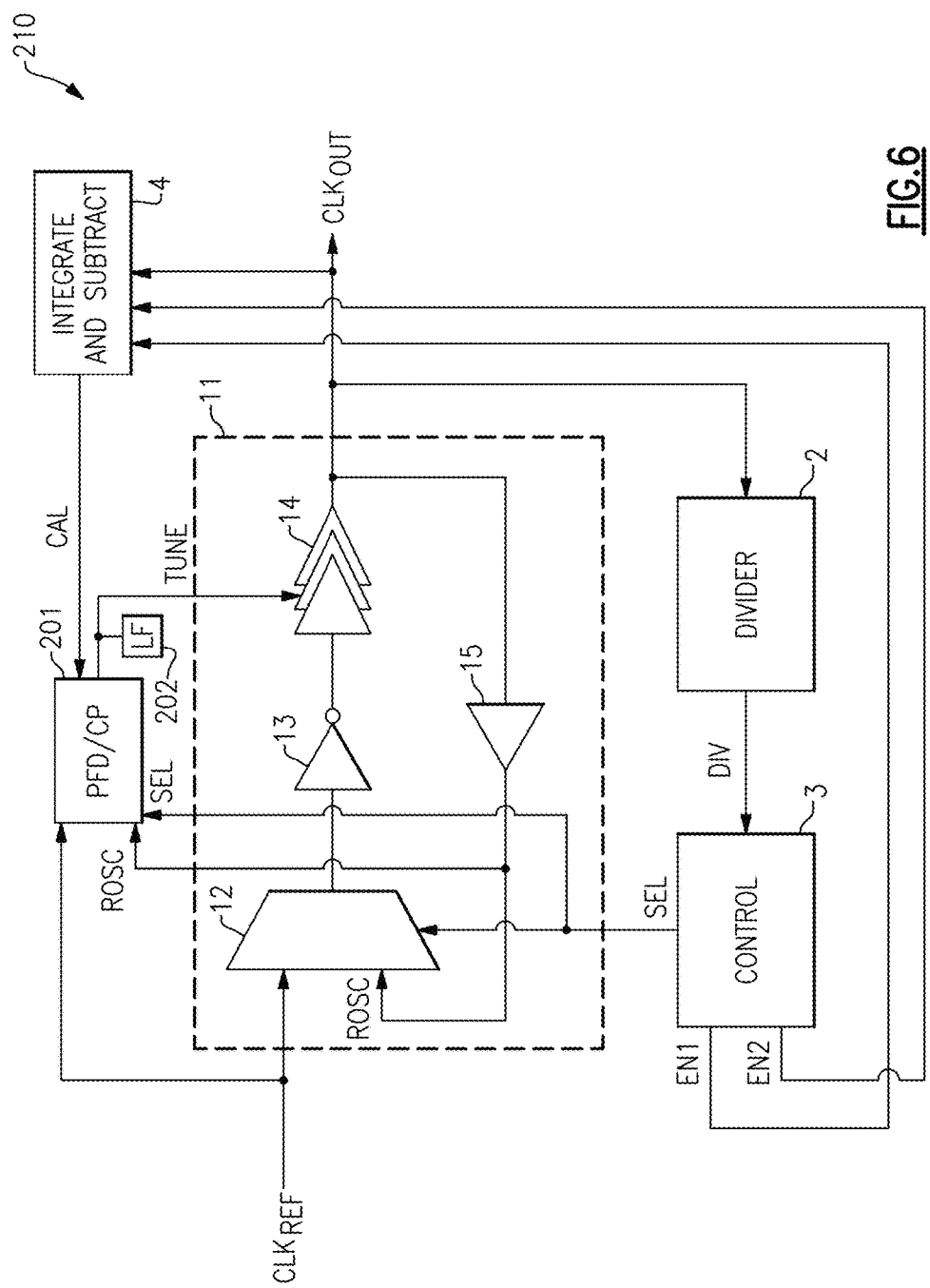
FIG. 6 is a schematic diagram of another embodiment of an MDLL with compensation for realignment error.

FIG. 6 is a schematic diagram of another embodiment of an MDLL 210 with compensation for realignment error. The MDLL 210 includes a multiplexed ring oscillator 11, a divider 2, a control circuit 3, an integrate and subtract circuit 4, a PFD/CP 201, and a loop filter 202.

The MDLL 210 of FIG. 6 is similar to the MDLL 20 of FIG. 2, except that the MDLL 210 further includes the PFD/CP 201 for controlling the tuning signal TUNE and a loop filter 202 for filtering the tuning signal TUNE to provide loop stability. Additionally, the integrate and subtract circuit 4 generates a calibration signal CAL for the PFD/CP 201. Thus, in contrast to the MDLL 20 of FIG. 2, the integrate and subtract circuit 4 of FIG. 6 does not generate the tuning signal TUNE, but rather the calibration signal CAL.

As shown in FIG. 6, the PFD/CP 201 receives the reference clock signal $CLK_{REF}$, the ring oscillator signal ROSC, the clock selection signal SEL, and the calibration signal CAL. Additionally, the PFD/CP 201 outputs the tuning signal TUNE. When the clock selection signal SEL is activated, the PFD/CP 201 adjusts the value of the tuning signal TUNE based on comparing the timing of the reference clock signal $CLK_{REF}$ to timing of the ring oscillator signal ROSC. The PFD/CP 201 can perform phase and/or frequency comparisons.

The PFD/CP 201 operates to align the reference clock signal $CLK_{REF}$ inputted to the PFD/CP 201 to the ring oscillator signal ROSC inputted to the PFD/CP 201. However, unknown delays, such as delays arising from conductive routes or traces and/or manufacturing variation, can result in a phase difference between the inputs to the multiplexer 12. Absent compensation, the difference in delays can result in a realignment error.

The integrate and subtract circuit 4 operates to generate a calibration signal CAL that reduces or eliminates the realignment error. In certain implementations, the calibration signal CAL provides a phase offset that aligns the phases of the inputs to the multiplexer 12, thereby providing phase alignment at the multiplexer's inputs rather than at the PFD/CP's inputs.

For example, the calibration signal CAL can control an amount of fixed charge into the loop filter 202 while the MDLL 210 is locked. Frequency lock will result in a substantially constant value of the tuning signal TUNE, but the phase of the multiplexed ring oscillator 11 will offset to cancel the introduced charge. Thus, the calibration signal CAL operates to control a phase offset to provide alignment at the multiplexer's inputs, rather than at the PFD/CP's inputs.

In the illustrated embodiment, the integrate and subtract circuit 4 generates the calibration signal CAL based on determining a difference between an integral of the output clock signal $CLK_{OUT}$ over an injected period and an integral of the output clock signal $CLK_{OUT}$ over a natural or non-injected period. Although an implementation in which the integrate and subtract circuit 4 integrates the output clock signal $CLK_{OUT}$ is shown, an integrate and subtract circuit can provide integration to other clock signals.

Figure 7A:
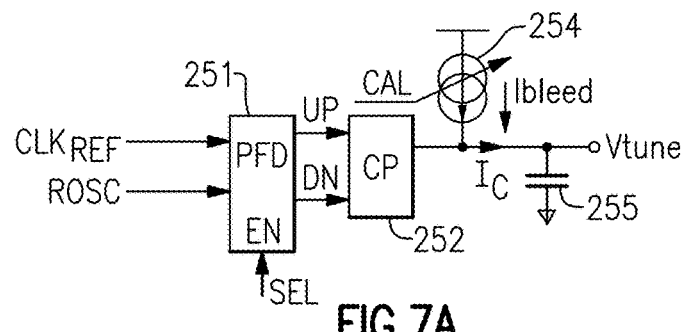
FIG. 7A is a schematic diagram of one embodiment of a phase-frequency detector and charge pump (PFD/CP) with calibration for realignment error.
Figure 7B:
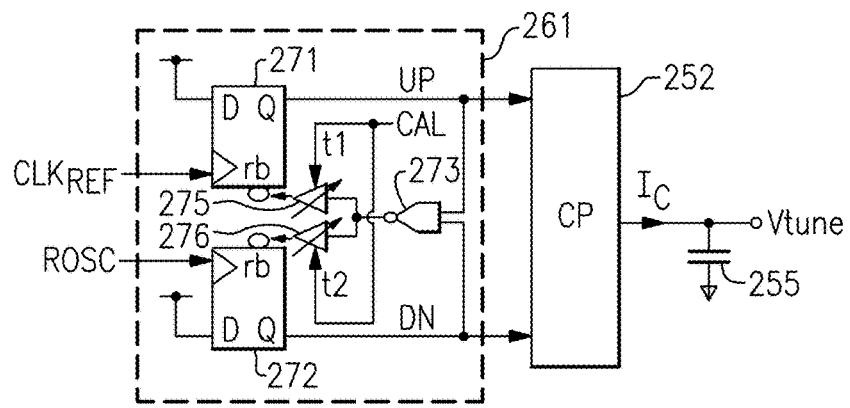
FIG. 7B is a schematic diagram of another embodiment of a PFD/CP with calibration for realignment error.

FIGS. 7A and 7B illustrate examples of PFD/CPs calibrated by an integrate and subtract circuit. The PFD/CP of FIG. 7A or the PFD/CP of FIG. 7B can be incorporated into an MDLL, such as the MDLL 210 of FIG. 6. Although two examples are shown, an integrate and subtract circuit can calibrate a PFD/CP for realignment error in a wide variety of ways.

FIG. 7A is a schematic diagram of one embodiment of a PFD/CP with calibration for realignment error. The PFD/CP includes a PFD 251, a CP 252, and a controllable current source 254, and is illustrated as being coupled to a loop capacitor 255. A current $I_C$ into the loop capacitor 255 has been depicted. Although the loop capacitor 255 illustrates one implementation of a loop filter, an MDLL can include a loop filter implemented in other ways.

As shown in FIG. 7A, the PFD 251 compares the reference clock signal $CLK_{REF}$ and the ring oscillator signal ROSC when the clock selection signal SEL is activated. The PFD 251 generates an up signal UP for controlling the CP 252 to charge the loop capacitor 255, and a down signal DN for controlling the CP 252 to discharge the loop capacitor 255. For example, the CP 252 can include an up current source selectively activated by the up signal UP and a down current source selectively activated by the down signal DN.

In the illustrated embodiment, the calibration signal CAL controls an amount of leakage current Ibleed provided by the controllable current source 254 to the loop capacitor 255. The current Ibleed of the controllable current source 254 controls a static phase offset between the reference clock signal $CLK_{REF}$ and the ring oscillator signal ROSC.

FIG. 7B is a schematic diagram of another embodiment of a PFD/CP with calibration for realignment error. The PFD/CP includes a PFD 261 and a CP 252, and is illustrated as being coupled to a loop capacitor 255. A current $I_C$ to the loop capacitor 255 has been depicted.

The PFD 261 includes a first detection element 271 (a D flip-flop, in this example), a second detection element 272 (a D flip-flop, in this example), a NAND gate 273, a first controllable delay element 275, and a second controllable delay element 276. In this example, the D flip-flops each include a data input (D) a data output (Q), a clock input, and a logically inverted reset (rb). For clarity of the figure, details of enabling the PFD 261 using the clock selection signal SEL have been omitted from FIG. 7B.

The calibration signal CAL operates to separately control a first delay t1 provided by the first controllable delay element 275 and a second delay t2 provided by the second controllable delay element 276. By controlling a delay in resetting the first detection element 271 relative to a delay in resetting the second detection element 272, a static phase offset between the reference clock signal $CLK_{REF}$ and the ring oscillator signal ROSC can be controlled.

Figure 7C:
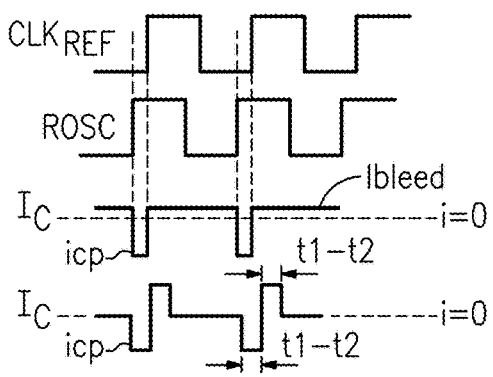
FIG. 7C is one example of a timing diagram for the PFD/CPs of FIGS. 7A and 7B.

FIG. 7C is one example of a timing diagram for the PFD/CPs of FIGS. 7A and 7B. The timing diagram includes a plot of the reference clock signal $CLK_{REF}$ versus time, a plot of the ring oscillator signal ROSC versus time, a plot of the current $I_C$ of FIG. 7A versus time, and a plot of the current $I_C$ of FIG. 7B versus time.

As shown in FIG. 7C, the current Ibleed provides a phase offset between the between the reference clock signal $CLK_{REF}$ and the ring oscillator signal ROSC. The amount of phase offset is controlled based on the value of the current Ibleed and a charge pump current icp from the CP 252. When the MDLL 210 of FIG. 6 is implemented with the PFD/CP of FIG. 7A, the integrate and subtract circuit 4 controls a value of the calibration signal CAL to provide a phase offset that aligns the inputs to the multiplexer 12. The phase offset also advantageously controls the duty cycle of an injected period to substantially equal the duty cycle of a non-injected period.

With continuing reference to FIG. 7C, the phase offset can additionally or alternatively be controlled based on a difference between the first delay t1 and the second delay t2 of the embodiment of FIG. 7B. The amount of phase offset is controlled based on the difference in the first delay t1 and the second delay t2, and on a charge pump current icp from the CP 252. When the MDLL 210 of FIG. 6 is implemented with the PFD/CP of FIG. 7B, the integrate and subtract circuit 4 controls a difference between the first delay t1 and the second delay t2 to align the inputs to the multiplexer 12 and substantially match the duty cycle of the injected period to the duty cycle of the non-injected period.

Figure 8A:
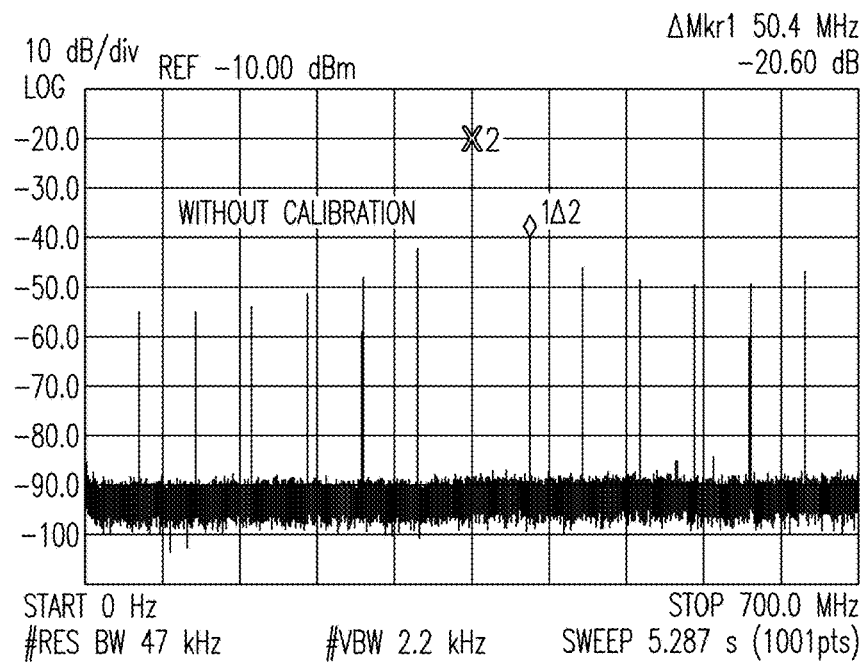
FIG. 8A is one example of output clock power versus frequency measurements for an MDLL without calibration for realignment error.

FIG. 8A is one example of output clock power versus frequency measurements for an MDLL without calibration for realignment error.

Figure 8B:
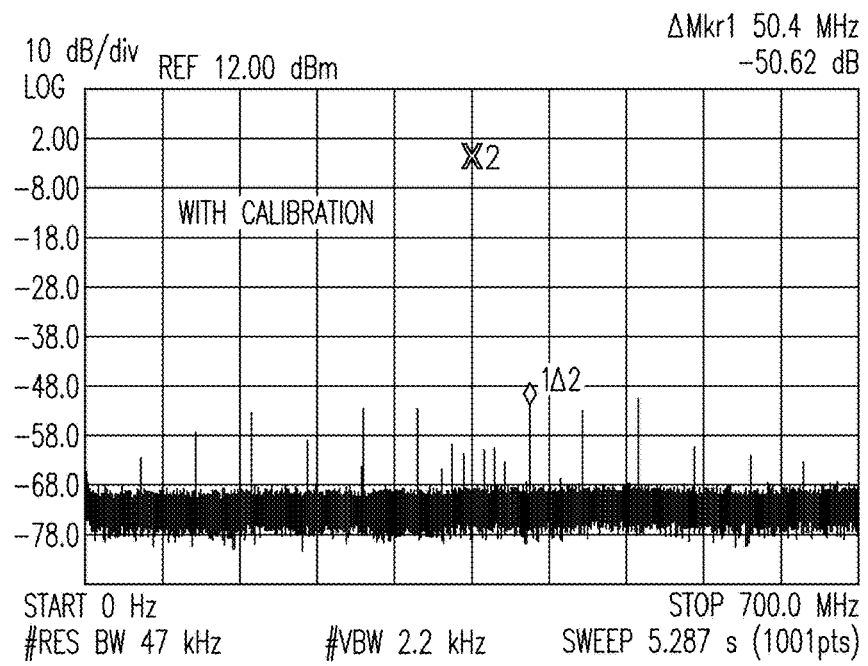
FIG. 8B is one example of output clock power versus frequency measurements for an MDLL with calibration for realignment error.

FIG. 8B is one example of output clock power versus frequency measurements for an MDLL with calibration for realignment error.

As shown by a comparison of FIG. 8A and FIG. 8B, including calibration for realignment error provides a reduction in the power of realignment spurs, and enhanced spectral purity of the output clock signal of the MDLL.

FIGS. 9A-9D are examples of electronic systems that can include an MDLL with compensation for realignment error in accordance with the teachings herein. Such electronic systems are impacted by the accuracy and/or precision of the clock signal used to control timing, and thus reducing or eliminating realignment error can improve system performance. Moreover, a reduction in realignment error can provide additional benefits, such as enhanced design flexibility and/or lower design cost. Although various examples of electronic systems are described below, MDLLs with compensation for realignment error can be used to control timing of a wide variety of downstream circuits.

FIG. 9A is a schematic diagram of one embodiment of a frequency synthesis system 410. The frequency synthesis system 410 includes a clock buffer 400, an MDLL 401, a divider 402 (divide by integer R, in this example), and a frequency synthesizer 403. The MDLL 401 is implemented in accordance with one or more of the features described herein.

In the illustrated embodiment, the MDLL 401 serves to control a frequency of a reference clock signal to the frequency synthesizer 403. Including the MDLL 401 helps to avoid boundary spurs at low frequency offsets of the fractional synthesizer 403, thereby enhancing flexibility of the frequency synthesizer and providing high performance across a wide range of operating parameters and/or usage scenarios.

For example, absent inclusion of the MDLL 401, the frequency synthesizer 403 can suffer from large spurs falling inside of the frequency synthesizer's loop bandwidth when the frequency synthesizer 403 operates at small fractional divide ratios. In contrast, including the MDLL 401 offers flexibility in setting an operating frequency of the PFD of the frequency synthesizer 403 away from frequencies associated with integer boundary spurs arising from the frequency synthesizer's voltage controlled oscillator (VCO) and/or output frequency.

FIG. 9B is a schematic diagram of one embodiment of a digital-to-analog data conversion system 420. The digital-to-analog data conversion system 420 includes an MDLL 401 and a DAC 413. The DAC 413 receives a digital input signal $D_{IN}$ and generates an analog output signal OUT. Additionally, the timing of conversion operations of the DAC 413 is controlled by the output clock signal $CLK_{OUT}$ from the MDLL 401. The MDLL 401 is implemented in accordance with one or more features herein, and thus the output clock signal $CLK_{OUT}$ has low realignment error to enhance the performance of the DAC 413.

FIG. 9C is a schematic diagram of one embodiment of an analog-to-digital data conversion system 430. The analog-to-digital data conversion system 430 includes an MDLL 401 and an ADC 423. The ADC 423 receives an analog input signal IN and generates a digital output signal $D_{OUT}$. The timing of conversion operations of the ADC 423 is controlled by the output clock signal $CLK_{OUT}$ from the MDLL 401. By implementing the analog-to-digital data conversion system 430 with an MDLL having low realignment error, superior operation of the ADC 423 can be achieved. For example, timing of data conversion operations can be more tightly controlled, which provides performance enhancement when using a single ADC as well as when using multiple ADCs to digitize signals associated with parallel lanes.

FIG. 9D is a schematic diagram of one embodiment of a radio frequency front-end system 440. The radio frequency front-end system 440 includes an MDLL 401, an upconverting mixer 431, a power amplifier (PA) 433, a downconverting mixer 432, a low noise amplifier (LNA) 434, an antenna access component 435 (for instance, a switch, duplexer, and/or circulator), and an antenna 436.

As shown in FIG. 9D, the MDLL 401 serves as a local oscillator for generating clock signals for frequency upconversion and frequency downconversion operations. In certain implementations, a polyphase filter or other suitable quadrature clock generation circuitry can be used to process the MDLL's output clock signal to generate a pair of clock signals having a quadrature phase relationship such that transmit and/or receive paths operate using quadrature signaling. By implementing the MDLL 401 in accordance with the teachings herein, data can be transmitted and/or received with higher spectral purity, which in turn leads to communication at higher bandwidth, at further distances, and/or over noisier radio environments.

Applications

Devices employing the above described schemes can be implemented into various electronic devices. Examples of electronic devices include, but are not limited to, consumer electronic products, parts of the consumer electronic products, electronic test equipment, communication infrastructure, etc. For instance, an MDLL with compensation for realignment error can be used in a wide range of analog, mixed-signal, and RF systems, including, but not limited to, data converters, chip-to-chip communication systems, clock and data recovery systems, base stations, mobile devices (for instance, smartphones or handsets), laptop computers, tablets, and wearable electronics. A wide range of consumer electronics products can also include an MDLL with compensation for realignment error for Internet of Things (TOT) applications. For instance, an MDLL with compensation for realignment error can be included in an automobile, a camcorder, a camera, a digital camera, a portable memory chip, a washer, a dryer, a washer/dryer, a copier, a facsimile machine, a scanner, a multi-functional peripheral device, or a wide range of other consumer electronics products. Furthermore, electronic devices can include unfinished products, including those for industrial, medical and automotive applications.

Conclusion

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A multiplying delay locked loop (MDLL) with compensation for realignment error, the MDLL comprising:
    a multiplexed oscillator configured to generate an oscillator signal;
    a control circuit configured to selectively inject a reference clock signal into the multiplexed oscillator to provide phase realignment; and
    an integrate and subtract circuit configured to compensate for a realignment error of the multiplexed oscillator based on determining a difference between a first integral of the oscillator signal and a second integral of the oscillator signal.

2. The MDLL of claim 1, wherein the integrate and subtract circuit is configured to determine the first integral when the control circuit injects the reference clock signal into the multiplexed oscillator, and to determine the second integral when the control circuit does not inject the reference clock signal into the multiplexed oscillator.

3. The MDLL of claim 1, wherein the integrate and subtract circuit comprises a switched resistor-capacitor (RC) integrator.

4. The MDLL of claim 3, wherein the switched RC integrator comprises a differential amplifier configured to generate a differential signal representing the difference between the first integral and the second integral, wherein the switched RC integrator comprises an input offset compensation circuit configured to compensate for an input offset of the differential amplifier.

5. The MDLL of claim 1, wherein the multiplexed oscillator comprises a controllable delay element, wherein the integrate and subtract circuit is configured to control a delay of the controllable delay element.

6. The MDLL of claim 1, wherein the multiplexed oscillator comprises a controllable delay element, wherein the MDLL further comprises a phase-frequency detector and charge pump configured to control a delay of the controllable delay element based on comparing timing of the multiplexed oscillator to timing of the reference clock signal.

7. The MDLL of claim 6, wherein the integrate and subtract circuit is configured to calibrate the phase-frequency detector and charge pump based on the difference.

8. The MDLL of claim 7, further comprising a loop filter coupled to an output of the phase-frequency detector and charge pump, wherein the integrate and subtract circuit is operable to calibrate an amount of leakage current to the loop filter.

9. The MDLL of claim 7, wherein the phase-frequency detector and charge pump comprises a first detection element and a second detection element configured to compare the timing of the multiplexed oscillator to the timing of the reference clock signal, wherein the integrate and subtract circuit is operable to calibrate a delay in resetting the first detection element relative to a delay in resetting the second detection element.

10. An electronic system comprising:
a multiplying delay locked loop (MDLL) configured to generate an output clock signal based on timing of a reference clock signal, wherein the MDLL comprises:
a multiplexed oscillator configured to generate an oscillator signal, wherein the multiplexed oscillator includes a multiplexer configured to receive the reference clock signal and the oscillator signal; and
an integrate and subtract circuit configured to compensate for a realignment error of the multiplexed oscillator based on a difference between a first integral of the oscillator signal and a second integral of the oscillator signal; and
a downstream circuit having timing controlled by the output clock signal of the MDLL.

11. The electronic system of claim 10, wherein the integrate and subtract circuit is configured to determine the first integral when the multiplexer selects the reference clock signal, and to determine the second integral when the multiplexer selects the oscillator signal.

12. The electronic system of claim 10, wherein the integrate and subtract circuit comprises a switched RC integrator.

13. The electronic system of claim 12, wherein the switched RC integrator comprises a differential amplifier configured to generate a differential signal representing the difference between the first integral and the second integral, wherein the switched RC integrator comprises an input offset compensation circuit configured to compensate for an input offset of the differential amplifier.

14. The electronic system of claim 10, wherein the multiplexed oscillator comprises a controllable delay element, wherein the integrate and subtract circuit is configured to control a delay of the controllable delay element.

15. The electronic system of claim 10, further comprising a control circuit configured to control selection of the multiplexer based on timing of the output clock signal.

16. The electronic system of claim 10, wherein the downstream circuit comprises a frequency synthesizer, wherein the output clock signal of the MDLL is configured to control an input reference frequency to the frequency synthesizer.

17. The electronic system of claim 10, wherein the downstream circuit comprises a data conversion circuit having timing of data conversion operations controlled by the output clock signal of the MDLL.

18. A method of compensating for realignment error in a multiplying delay locked loop (MDLL), the method comprising:
generating an oscillator signal using a multiplexed oscillator, including regularly injecting a reference clock signal into the multiplexed oscillator to thereby provide phase realignment;
determining a first integral of the oscillator signal;
determining a second integral of the oscillator signal; and
compensating for a realignment error of the multiplexed oscillator based on a difference between the first integral and the second integral.

19. The method of claim 18, wherein determining the first integral comprises integrating the oscillator signal while the reference clock signal is being injected, and wherein determining the second integral comprises integrating the oscillator signal while the reference clock signal is not being injected.

20. The method of claim 18, further comprising controlling an adjustable delay of the multiplexed oscillator based on the difference between the first integral and the second integral.

* * * * *